United States Patent
Yang et al.

(10) Patent No.: US 9,773,817 B2
(45) Date of Patent: Sep. 26, 2017

(54) THIN FILM TRANSISTOR AND MANUFACTURING METHOD THEREOF, ARRAY SUBSTRATE AND DISPLAY DEVICE

(71) Applicants: BOE TECHNOLOGY GROUP CO., LTD., Beijing (CN); HEFEI BOE OPTOELECTRONICS TECHNOLOGY CO., LTD., Hefei, Anhui (CN)

(72) Inventors: Haipeng Yang, Beijing (CN); Yongjun Yoon, Beijing (CN); Zhizhong Tu, Beijing (CN); Jaikwang Kim, Beijing (CN)

(73) Assignees: BOE TECHNOLOGY GROUP CO., LTD., Beijing (CN); HEFEI BOE OPTOELECTRONICS TECHNOLOGY CO., LTD., Hefei, Anhui (CN)

( * ) Notice: Subject to any disclaimer, the term of this patent is extended or adjusted under 35 U.S.C. 154(b) by 2 days.

(21) Appl. No.: 14/415,660

(22) PCT Filed: Jun. 30, 2014

(86) PCT No.: PCT/CN2014/081193
§ 371 (c)(1),
(2) Date: Jan. 19, 2015

(87) PCT Pub. No.: WO2015/027747
PCT Pub. Date: Mar. 5, 2015

(65) Prior Publication Data
US 2016/0013209 A1    Jan. 14, 2016

(30) Foreign Application Priority Data

Sep. 2, 2013  (CN) .......................... 2013 1 0393339

(51) Int. Cl.
*H01L 29/786* (2006.01)
*H01L 27/12* (2006.01)
(Continued)

(52) U.S. Cl.
CPC ...... *H01L 27/124* (2013.01); *H01L 21/02565* (2013.01); *H01L 21/441* (2013.01);
(Continued)

(58) Field of Classification Search
CPC ................................................ H01L 21/76829
See application file for complete search history.

(56) References Cited

U.S. PATENT DOCUMENTS

| 2009/0289258 A1* | 11/2009 | Kim | H01L 29/66765 257/66 |
| 2013/0334530 A1* | 12/2013 | Katoh | H01L 27/1222 257/43 |
| 2015/0021592 A1* | 1/2015 | Seo | H01L 29/7869 257/43 |

FOREIGN PATENT DOCUMENTS

| CN | 103219391 A | 7/2013 |
| CN | 103227208 A | 7/2013 |

(Continued)

OTHER PUBLICATIONS

International Search Report dated Jun. 30, 2014 from application No. PCT/CN2014/081193.
(Continued)

*Primary Examiner* — Peniel M Gumedzoe
*Assistant Examiner* — Christopher Johnson
(74) *Attorney, Agent, or Firm* — Nath, Goldberg & Meyer; Joshua B. Goldberg; Christopher Thomas

(57) ABSTRACT

The present invention provides a thin film transistor and a manufacturing method thereof, an array substrate and a display device. The thin film transistor comprises a gate
(Continued)

electrode, an active layer, an etch stop layer, a source electrode and a drain electrode. The etch stop layer is provided between the active layer and the source and drain electrodes, a first via hole and a second via hole are formed in the etch stop layer, the source electrode is connected with the active layer through the first via hole, the drain electrode is connected with the active layer through the second via hole, and the gate electrode is overlapped with a part of the first via hole and a part of the second via hole respectively and is overlapped with a portion between the first via hole and the second via hole.

17 Claims, 9 Drawing Sheets

(51) Int. Cl.
| | |
|---|---|
| *H01L 29/417* | (2006.01) |
| *H01L 21/02* | (2006.01) |
| *H01L 21/441* | (2006.01) |
| *H01L 21/768* | (2006.01) |
| *H01L 23/522* | (2006.01) |
| *H01L 23/528* | (2006.01) |
| *H01L 23/532* | (2006.01) |
| *H01L 29/24* | (2006.01) |
| *H01L 29/423* | (2006.01) |
| *H01L 29/66* | (2006.01) |

(52) U.S. Cl.
CPC .. *H01L 21/76802* (2013.01); *H01L 21/76832* (2013.01); *H01L 23/528* (2013.01); *H01L 23/5226* (2013.01); *H01L 23/53295* (2013.01); *H01L 27/1259* (2013.01); *H01L 29/24* (2013.01); *H01L 29/4175* (2013.01); *H01L 29/41733* (2013.01); *H01L 29/42384* (2013.01); *H01L 29/66969* (2013.01); *H01L 29/7869* (2013.01); *H01L 29/78606* (2013.01); *H01L 2924/0002* (2013.01)

(56) References Cited

FOREIGN PATENT DOCUMENTS

| | | |
|---|---|---|
| CN | 103456795 A | 12/2013 |
| CN | 203423189 U | 2/2014 |
| WO | 2012124511 A1 | 9/2012 |

OTHER PUBLICATIONS

Form PCT/ISA/237 issued for International Application No. PCT/CN2014/081193 dated Oct. 10, 2014.
1st Office Action issued for International Application No. 201310393339.8 dated Jun. 25, 2015.

* cited by examiner

THIN FILM TRANSISTOR AND MANUFACTURING METHOD THEREOF, ARRAY SUBSTRATE AND DISPLAY DEVICE

This is a National Phase Application filed under 35 U.S.C. 371 as a national stage of PCT/CN2014/081193, filed on Jun. 30, 2014, an application claiming the benefit from Chinese Application No. 201310393339.8, filed on Sep. 2, 2013, the entire content of each of which is hereby incorporated by reference in its entirety.

FIELD OF THE INVENTION

The present invention relates to the technical field of liquid crystal display, and particularly relates to a thin film transistor and a manufacturing method thereof, an array substrate and a display device.

BACKGROUND OF THE INVENTION

A thin film transistor liquid crystal display (TFT-LCD) with the advantages of high picture quality, high space utilization rate, low power consumption, no radiation and the like, has become a mainstream product on the market. In the TFT liquid crystal display, at least one TFT is designed on each pixel, and each independent pixel on a screen is controlled through the TFT, so that the response time may be greatly improved.

Indium gallium zinc oxide (IGZO) is a new-generation material for a TFT active layer, and the carrier mobility of the IGZO is 5 to 10 times larger than that of amorphous silicon, so that the charge and discharge speed of pixel electrodes may be greatly improved, and the response speed of pixels may be improved to realize a faster refresh rate.

When the amorphous silicon is used as a material for the active layer, a metal electrode layer may be directly manufactured on the active layer, and then desired patterns of source and drain electrodes are formed through etching; and when the IGZO is used for the active layer, since the IGZO is not anticorrosive like the amorphous silicon and an IGZO layer is easily damaged in the etching process of the source and drain electrodes, an etch stop layer needs to be manufactured on the IGZO active layer first to protect the IGZO layer, and then a source and drain metal electrode layer is manufactured. FIG. 1 is a schematic top view of a thin film transistor in the prior art. As shown in FIG. 1, the thin film transistor comprises a source electrode 1, a drain electrode 2, a gate electrode 3, an IGZO active layer (not shown in the figure), an etch stop layer 5 on the IGZO active layer and two opposite via holes formed in the etch stop layer 5, wherein the source electrode 1 is electrically connected with the IGZO active layer through the via hole 7, and the drain electrode 2 is electrically connected with the IGZO active layer through the via hole 6. In the practical TFT manufacturing process, due to the influence of minimum precision (namely resolution) of an exposure machine, the patterns close to the minimum precision are influenced by imaging, development and etching, then the formed via holes have certain deformation, the practically formed via holes are of rectangles with rounded corners and even are approximately round. The source electrode and the drain electrode are connected with the active layer through the via holes, and the width of a channel formed when the TFT is turned on is determined by the diameters of the round holes. Thus, the channel length of the TFT is determined by the distance between the via hole 6 and the via hole 7, and the width of the channel of the TFT is determined by the side lengths (diameters) of the via hole 6 and the via hole 7.

The prior art has the following problems: in the structure as shown in FIG. 1, the parasitic capacitance between the source electrode and the gate electrode of the TFT and the parasitic capacitance between the drain electrode and the gate electrode of the TFT are relatively high, so that when the TFT is used for a liquid crystal display, fluctuation of a pixel voltage is increased, and the display effect is reduced.

SUMMARY OF THE INVENTION

The present invention provides a thin film transistor and a manufacturing method thereof, an array substrate and a display device, for reducing fluctuation of a pixel voltage and improving the display effect.

To achieve the above purposes, the present invention provides a thin film transistor, comprising a gate electrode, an active layer, an etch stop layer, a source electrode and a drain electrode, the etch stop layer is provided between the active layer and the source and drain electrodes, a first via hole and a second via hole are formed in the etch stop layer, the source electrode is connected with the active layer through the first via hole, the drain electrode is connected with the active layer through the second via hole, and the gate electrode is overlapped with a part of the first via hole and a part of the second via hole respectively and is overlapped with a portion between the first via hole and the second via hole.

The first via hole and the second via hole may be of rectangles with rounded corners; a projection of one side of the gate electrode overlapped with the first via hole on a plane of the first via hole may be respectively intersected with two opposite straight sides of the first via hole; and a projection of another side of the gate electrode overlapped with the second via hole on a plane of the second via hole may be respectively intersected with two opposite straight sides of the second via hole.

The gate electrode may be overlapped with at least two rounded corner parts at one side of the first via hole and at one side of the second via hole, respectively.

The gate electrode may be overlapped with at least half of the first via hole and at least half of the second via hole, respectively.

Shapes of the first via hole and the second via hole may be identical to each other.

Areas of the first via hole and the second via hole may be equal to each other.

The active layer may be an indium gallium zinc oxide film layer.

The etch stop layer may be a silicon oxide film layer, a silicon nitride film layer or a composite layer formed by silicon oxide and silicon nitride.

The gate electrode, a gate insulating layer, the active layer, the etch stop layer, the source electrode and the drain electrode may be sequentially provided from a substrate side for providing the thin film transistor.

The active layer, the etch stop layer, the source electrode and the drain electrode, a gate insulating layer and the gate electrode may be sequentially provided from a substrate side for providing the thin film transistor.

To achieve the above purposes, the present invention provides an array substrate, comprising the above-mentioned thin film transistor.

To achieve the above purposes, the present invention provides a display device, comprising the above-mentioned array substrate.

To achieve the above purposes, the present invention provides a manufacturing method of a thin film transistor, comprising: forming a gate electrode; forming an active layer; forming an etch stop layer, and forming a first via hole and a second via hole in the etch stop layer by using a patterning process, so that the gate electrode is overlapped with a part of the first via hole and a part of the second via hole and overlapped with a portion between the first via hole and the second via hole; and forming a source and drain metal layer, and forming a source electrode and a drain electrode by using a patterning process, so that the source electrode is connected with the active layer through the first via hole, and the drain electrode is connected with the active layer through the second via hole.

The gate electrode may be overlapped with at least half of the first via hole and at least half of the second via hole, respectively.

The first via hole and the second via hole may be of rectangles with rounded corners, and the gate electrode may be overlapped with at least two rounded corner parts at one side of the first via hole and at one side of the second via hole, respectively.

In the thin film transistor provided by the present invention, the areas of opposite portions between the gate electrode and the source electrode and between the gate electrode and the drain electrode are reduced, so that the parasitic capacitances between the source electrode and the gate electrode and between the drain electrode and the gate electrode are reduced, then fluctuation of a pixel voltage is reduced and the display effect is improved.

DESCRIPTION OF THE PREFERRED EMBODIMENT

To make those skilled in the art better understand the technical schemes of the present invention, a thin film transistor and a manufacturing method thereof, an array substrate and a display device provided by the present invention will be further described in detail below in combination with the accompanying drawings.

Figure 1:
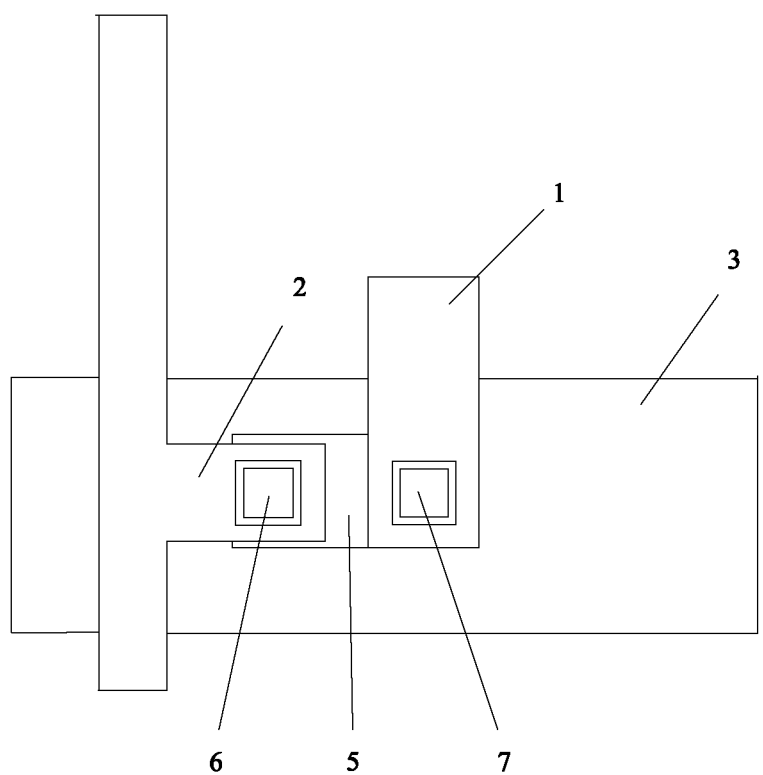
FIG. 1 is a schematic top view of a thin film transistor in the prior art.
Figure 2:
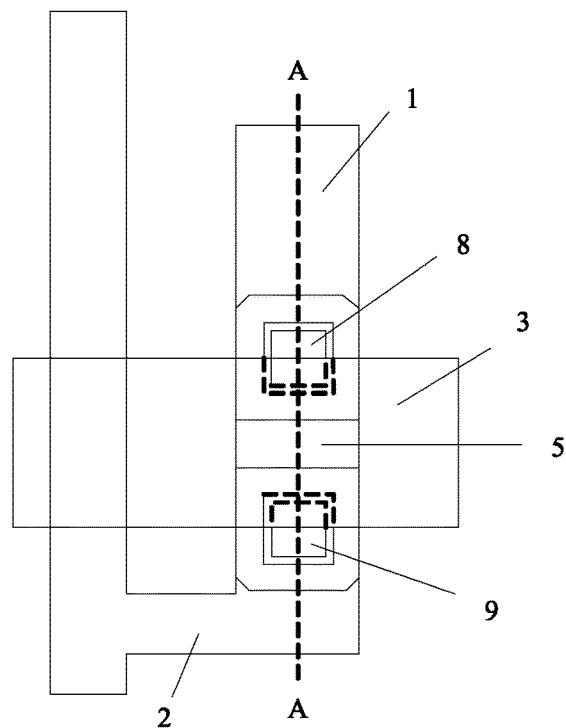
FIG. 2 is a schematic top view of a thin film transistor provided by a first embodiment of the present invention.
Figure 3:
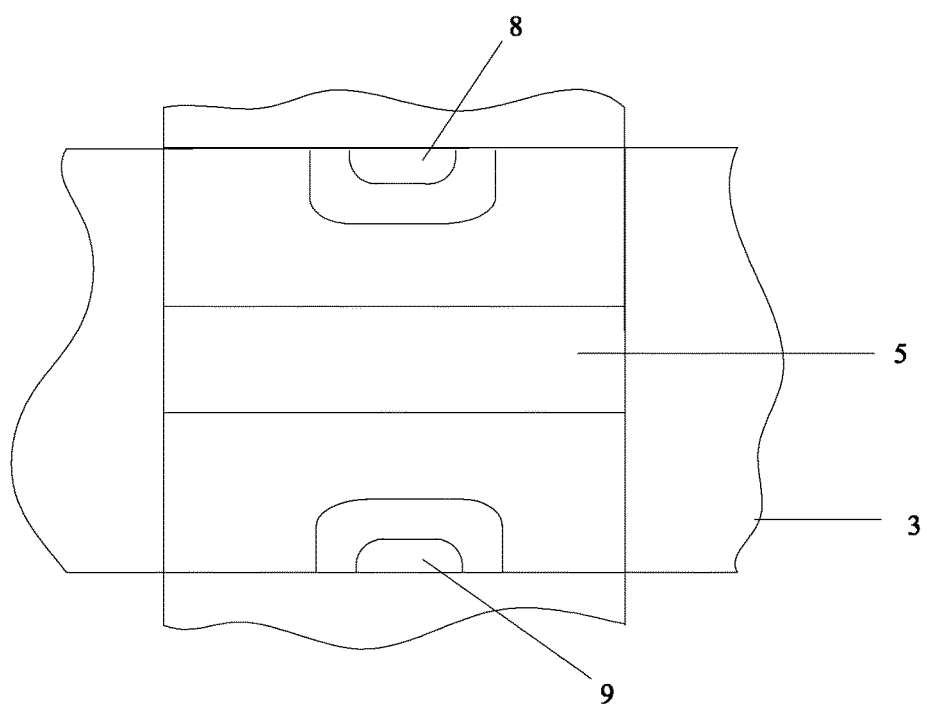
FIG. 3 is a partially enlarged schematic diagram illustrating that via holes of the thin film transistor in the first embodiment are of corner-rounded rectangles.

FIG. 2 is a schematic top view of a thin film transistor provided by a first embodiment of the present invention, and FIG. 3 is a partially enlarged schematic diagram of the thin film transistor in FIG. 2. As shown in FIG. 2 and FIG. 3, the thin film transistor comprises a gate electrode 3, an active layer, an etch stop layer 5, a source electrode 1 and a drain electrode 2, wherein the etch stop layer 5 is provided between the active layer and the source electrode 1 and the drain electrode 2, a first via hole 8 and a second via hole 9 are formed in the etch stop layer 5, the source electrode 1 is connected with the active layer through the first via hole 8, the drain electrode 2 is connected with the active layer through the second via hole 9, and the gate electrode 3 is overlapped with a part (namely not all) of the first via hole 8 and a part of the second via hole 9 and is overlapped with a portion between the first via hole 8 and the second via hole 9.

In this embodiment, for example, the first via hole 8 and the second via hole 9 are of rectangles with rounded corners; the projection of one side of the gate electrode 3 overlapped with the first via hole 8 on the plane of the first via hole 8 is respectively intersected with two opposite straight sides of the first via hole 8; and the projection of another side of the gate electrode 3 overlapped with the second via hole 9 on the plane of the second via hole 9 is respectively intersected with two opposite straight sides of the second via hole 9.

FIG. 3 is a partially enlarged schematic diagram illustrating that the via holes of the thin film transistor in the first embodiment are of corner-rounded rectangles. As shown in FIG. 3, the gate electrode 3 may be overlapped with a part smaller than half of the first via hole 8 and a part smaller than half of the second via hole 9, respectively, that is to say, the projection of one side of the gate electrode 3 on the plane of the first via hole 8 may be intersected with the two opposite straight sides of the first via hole 8, and the projection of another side of the gate electrode 3 on the plane of the second via hole 9 may be intersected with the two opposite straight sides of the second via hole 9, so that the entire channel may be controlled by the gate electrode when the thin film transistor is turned on.

In this embodiment, the gate electrode 3 may be provided under the active layer 4, and the etch stop layer 5 may be provided above the active layer 4. When the size of the formed via holes approaches the limit capability of an exposure machine, the gate electrode 3 is overlapped with at least half of the first via hole 8 and at least half of the second via hole 9, respectively, and is overlapped with a portion between the first via hole 8 and the second via hole 9. The first via hole 8 and the second via hole 9 are identical in shape and equal in area.

The active layer 4 may be an indium gallium zinc oxide (IGZO) film layer, and the material for the active layer may be not limited to IGZO in practical application.

Further, the etch stop layer 5 may be a silicon oxide (SiOx) film layer, a silicon nitride (SiNx) film layer or a composite layer formed by silicon oxide (SiOx) and silicon nitride (SiNx).

In this embodiment, the structure of the thin film transistor may be of a bottom-gate type structure or a top-gate type structure. In the bottom-gate type structure, the gate electrode, a gate insulating layer, the active layer, the etch stop layer, the source electrode and the drain electrode are sequentially provided from a substrate side for providing the thin film transistor. In the top-gate type structure, the active layer, the etch stop layer, the source electrode and the drain electrode, a gate insulating layer and the gate electrode are sequentially provided from a substrate side for providing the thin film transistor.

It should be noted that, the thin film transistor in the embodiment of the present invention may be a bottom-gate type thin film transistor (namely the gate electrode is positioned under an active layer pattern) or a top-gate type thin film transistor (namely the gate electrode is positioned above the active layer pattern).

Figure 4:
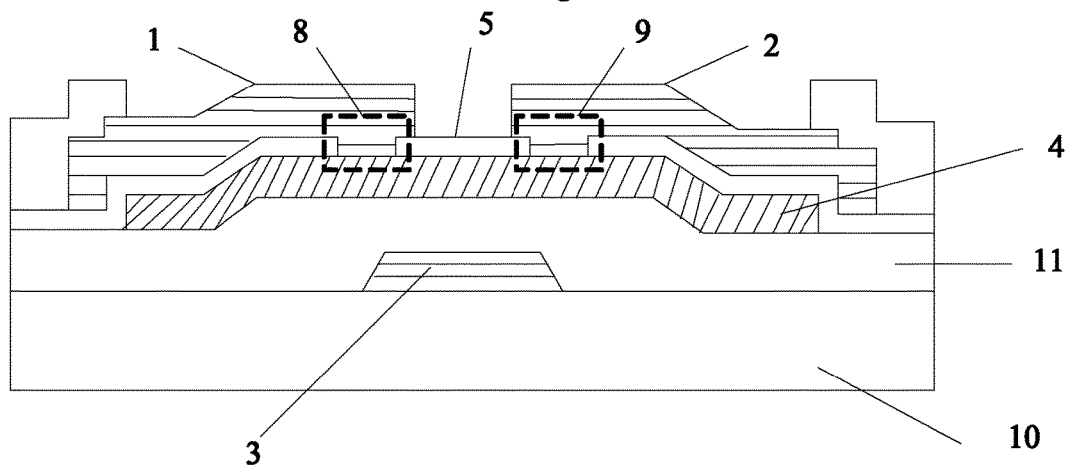
FIG. 4 is a cross sectional view of the bottom-gate type thin film transistor taken along an A-A line in FIG. 2.

When the bottom-gate type TFT structure in this embodiment is manufactured, as shown in FIG. 4, the gate electrode 3 and the gate insulating layer 11 are sequentially manufactured on the substrate 10 first, and since the material (such as IGZO) for manufacturing the active layer 4 is not anticorrosive, the etch stop layer 5 needs to be manufactured on the active layer 4 to protect the active layer 4 from being influenced by etchant or moisture. After the etch stop layer 5 is manufactured on the active layer 4, the first via hole 8 and the second via hole 9 are formed in the etch stop layer 5 by a dry etching method or other method, then a source and drain metal layer is formed on the etch stop layer 5, and finally, the desired shapes of the source electrode 1 and the drain electrode 2 are formed by a patterning process.

The first via hole 8 and the second via hole 9 penetrate through the etch stop layer 5, so that the source and drain electrodes on the etch stop layer 5 may be connected with the active layer 4 under the etch stop layer 5. The size of the via holes and the distance between the via holes are determined by the process capability of a factory, and the specifically involved factors include alignment precision of the via holes and the source and drain electrodes, minimum etching width of the source and drain electrodes and minimum etching width of the via holes.

Figure 5:
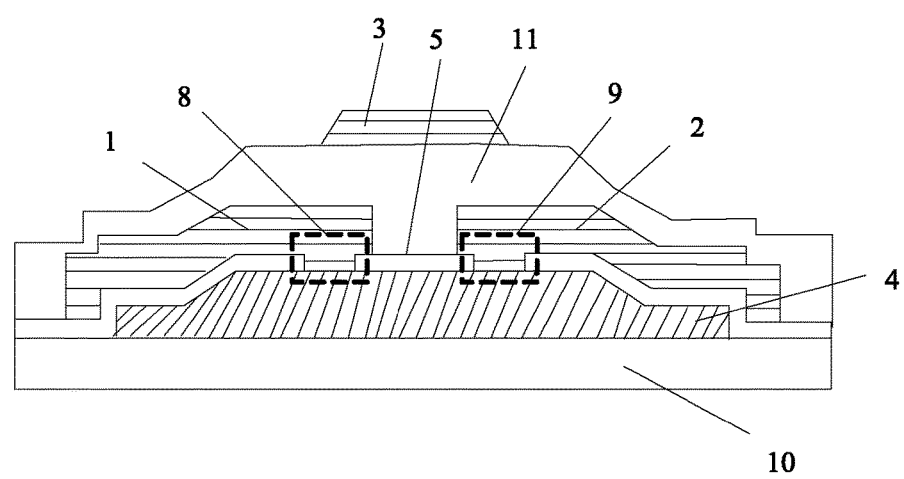
FIG. 5 is a cross sectional view of the top-gate type thin film transistor taken along an A-A line in FIG. 2.

FIG. 5 is a cross sectional view of the top-gate type thin film transistor taken along an A-A line in FIG. 2. As shown in FIG. 5, the thin film transistor comprises a substrate 10, an active layer 4 formed on the substrate 10, an etch stop layer 5 formed on the active layer 4, a source electrode 1 and a drain electrode 2 which are formed on the etch stop layer 5, a gate insulating layer 11 formed on the source electrode 1 and the drain electrode 2 and a gate electrode 3 formed on the gate insulating layer 11, wherein the source electrode 1 is connected with the active layer 4 through a first via hole 8, and the drain electrode 2 is connected with the active layer 4 through a second via hole 9.

The parasitic capacitances and aperture ratios between the source and gate electrodes and between the drain and gate electrodes of the TFT in the present invention and the existing TFT will be specifically compared below under the condition of the same channel width.

Figure 6:
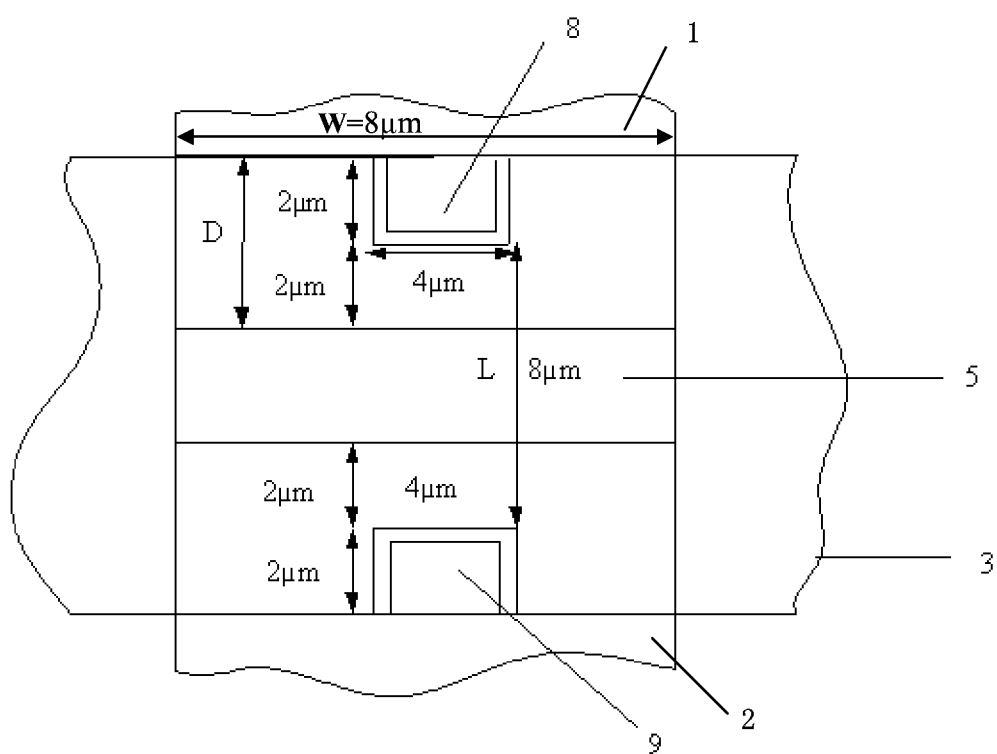
FIG. 6 is a schematic top view of an etch stop layer in the first embodiment of the present invention.

FIG. 6 is a schematic top view of the etch stop layer in the first embodiment of the present invention. As shown in FIG. 6, specifically, according to the common process capability of an existing factory, it is supposed that after the first via hole 8 for connecting the source electrode 1 with the active layer 4 and the second via hole 9 for connecting the drain electrode 2 with the active layer 4 are formed, both of the first via hole 8 and the second via hole 9 are square, the side lengths of the square are 4 μm, and the distance between the first via hole 8 and the second via hole 9 is 8 μm. The source electrode 1 covers the first via hole 8, one side of the source electrode 1 exceeds one side of the first via hole 8 for 2 μm, the drain electrode 2 covers the second via hole 9, and one side of the drain electrode 2 exceeds one side of the second via hole 9 for 2 μm. The sum of lengths of three sides (the dotted part in FIG. 2) of the first via hole 8 covered by the source electrode 1 is 2 μm+2 μm+4 μm=8 μm, and the sum of lengths of three sides (the dotted part in FIG. 2) of the second via hole 9 covered by the drain electrode 2 is 2 μm+2 μm+4 μm=8 μm. The gate electrode 3 is overlapped with half of the first via hole 8 and half of the second via hole 9 respectively and is overlapped with a portion between the first via hole 8 and the second via hole 9, namely the width of the gate electrode 3 is 8 μm+2 μm+2 μm=12 μm.

In this case, the channel length of the TFT, namely the distance between the first via hole 8 and the second via hole 9, is 8 μm, and the effective width of the channel is 4 μm. In the practical TFT manufacturing process, due to the influence of minimum precision (namely resolution) of an exposure machine, the patterns close to the minimum precision are influenced by imaging, development and etching, then the formed via holes have certain deformation, the practically formed via holes are of rectangles with rounded corners and even are approximately round, and the source electrode and the drain electrode are connected with the active layer and turned on through the via holes. When the practically formed via holes are approximately round, the width of the channel is determined by the diameter of the round holes. Thus, the effective width of the channel under the above condition, namely the diameter of the round holes, is 4 μm.

The length of the opposite parts (namely the overlapped parts) of the source electrode 1 and the gate electrode 3 is the width of the source electrode: W=8 μm, and the width of the opposite parts of the source electrode 1 and the gate electrode 3 is: the sum of the side length of half of the first via hole 8 covered by the gate electrode 3 and the length of one side of the source electrode 1 exceeding one side of the first via hole 8, namely D=2 μm+2 μm=4 μm, so the area of the opposite parts of the source electrode 1 and the gate electrode 3 is $S1=D \times W=4 \mu m \times 8 \mu m=32 \mu m^2$. Similarly, the area of the opposite parts of the drain electrode 2 and the gate electrode 3 is also 32 $\mu m^2$.

Figure 7:
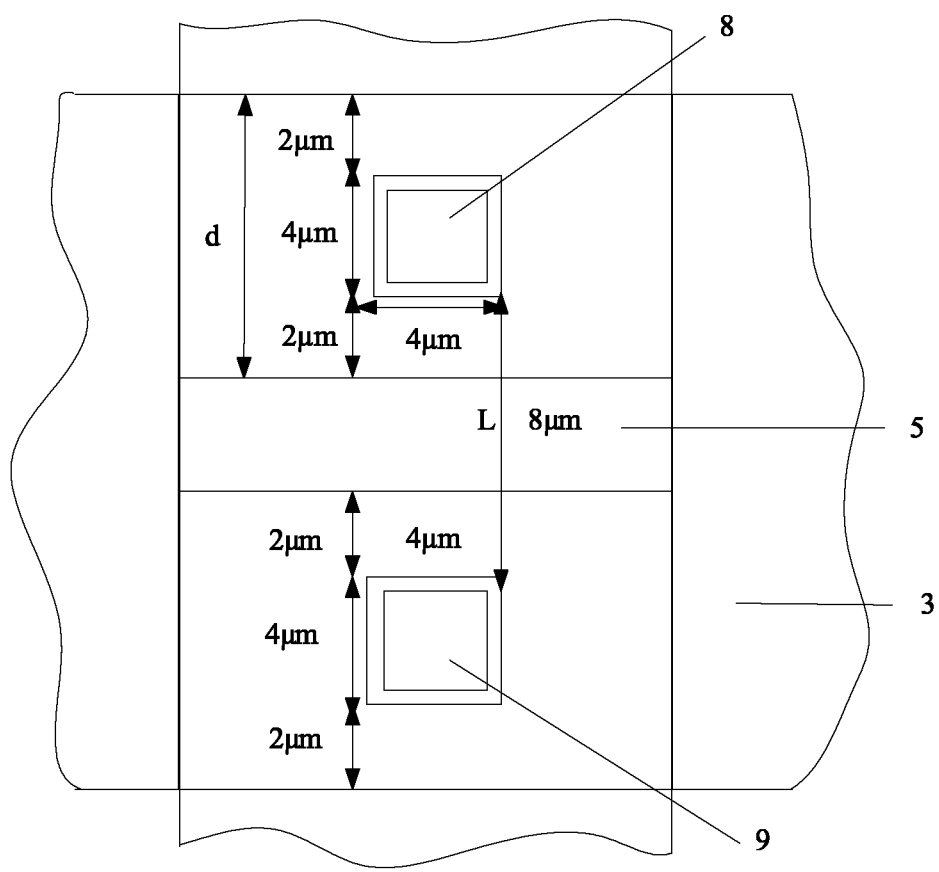
FIG. 7 is a schematic top view of an etch stop layer in the thin film transistor of the prior art.

FIG. 7 is a schematic top view of the etch stop layer in the thin film transistor of the prior art. As shown in FIG. 7, in the existing thin film transistor, the gate electrode 3 is completely overlapped with the first via hole 8 and the second via hole 9, then the channel length of the TFT, namely the distance between the first via hole 8 and the second via hole 9, is 8 μm; the effective width of the channel is 4 μm; the length of the opposite parts of the source electrode 1 and the gate electrode 3 is the width of the source electrode: W=8 μm; and the width of the opposite parts of the source electrode 1 and the gate electrode 3 is: the sum of the side length of the first via hole 8 covered by the gate electrode 3, the length of one side of the source electrode 1 exceeding one side of the first via hole 8, and the length of one side of the gate electrode 3 exceeding one side of the first via hole 8, namely d=4 μm+2 μm+2 μm=8 μm, and the area of the opposite parts of the source electrode 1 and the gate electrode 3 is $S2=d \times W=8 \mu m \times 8 \mu m=64 \mu m^2$. Similarly, the area of the opposite parts of the drain electrode 2 and the gate electrode 3 is also 64 $\mu m^2$.

As can be seen from above, by comparing the two designs, the channel widths are set as 4 μm likewise, and the channel lengths are set as 8 μm likewise. However, in the reference direction perpendicular to the TFT substrate, the area of the source electrode facing the gate electrode and the area of the drain electrode facing the gate electrode in the TFT of this embodiment are respectively reduced by 32 $\mu m^2$ with respect to those in the TFT of the prior art.

In practical application, the parasitic capacitance between the source and gate electrodes of the TFT is mainly determined by the area of the source electrode facing the gate electrode, the parasitic capacitance between the drain and gate electrodes is mainly determined by the area of the drain electrode facing the gate electrode, and it could be observed according to the calculation result that, under the condition of TFT channel widths being equal and TFT occupied areas being approximately equal, the area of the source electrode facing the gate electrode and the area of the drain electrode facing the gate electrode in the TFT of this embodiment are greatly reduced. The aperture ratio is relevant to the TFT occupied area, namely the larger the TFT occupied area is, the lower the aperture ratio of pixels is, whereas the smaller the TFT occupied area is, the higher the aperture ratio of pixels is. It could be observed from the above calculation result that S1 is 32 $\mu m^2$ and S2 is 64 $\mu m^2$ that, this embodiment effectively reduces the parasitic capacitances between the source and gate electrodes and between the source and drain electrodes and achieves the purposes of reducing fluctuation of a pixel voltage and improving the display effect without affecting the aperture ratio of pixels.

It should be understood that, the above specific example is merely an example of an extreme case when the size of the formed via holes approaches the limit capability of the exposure machine. In practice, when the size of the via holes to be formed is relatively large, the practical shape of the via holes is a rectangle with rounded corners, then if the width of the channel needs to be kept unchanged, the gate electrode is not required to be overlapped with half of each via hole, and only the part of the gate electrode overlapped with each via hole needs to cover the rounded corner parts on one side, namely the gate electrode may be respectively overlapped with at least the two rounded corner parts at one side of the first via hole and at one side of the second via hole.

Figure 8:
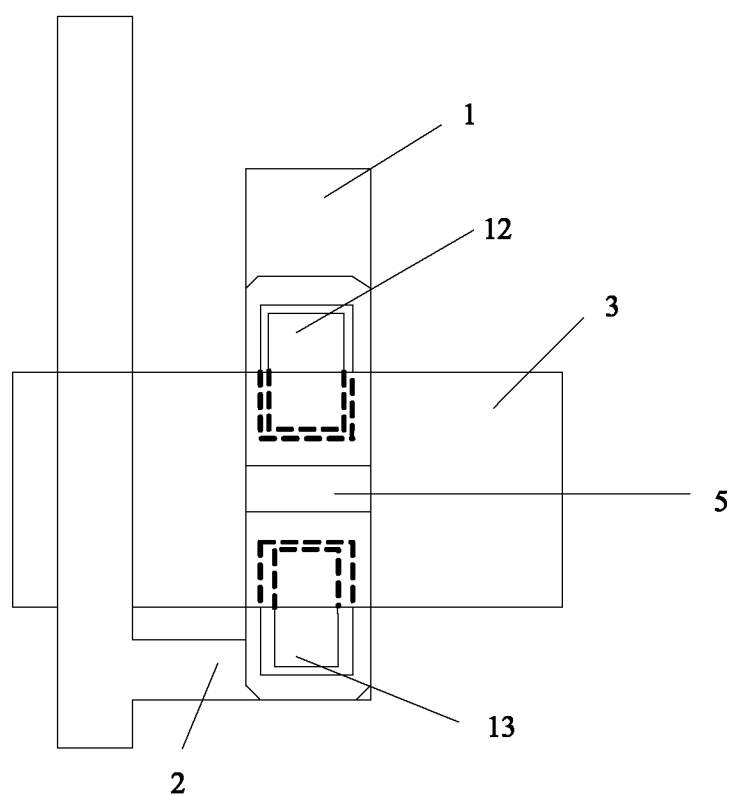
FIG. 8 is a schematic top view of a thin film transistor provided by a second embodiment of the present invention.
Figure 9:
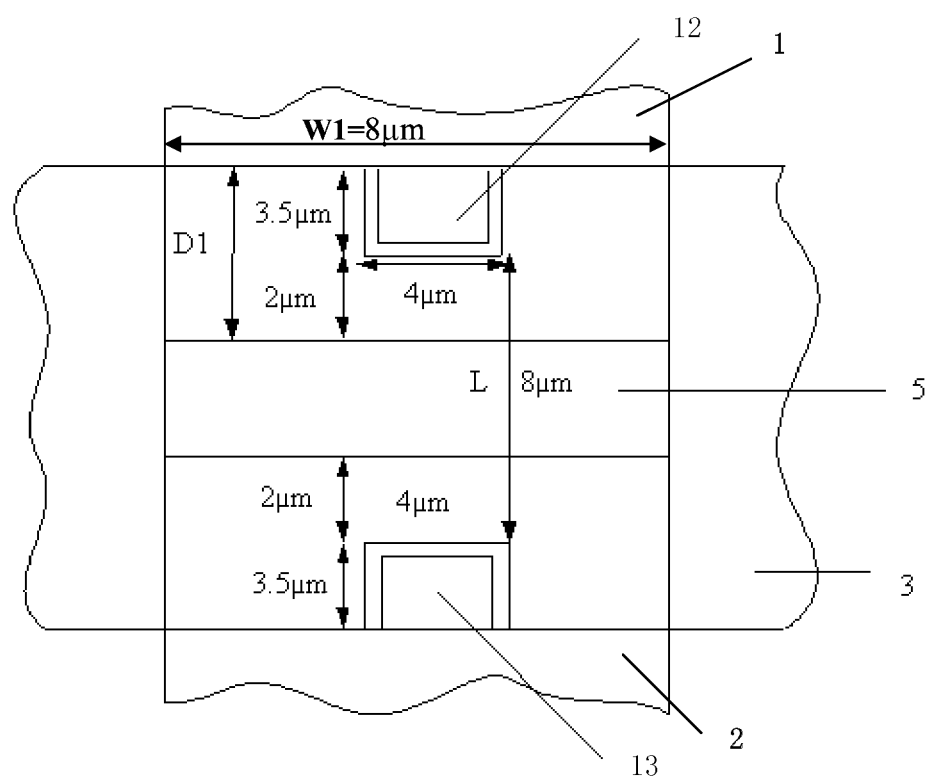
FIG. 9 is a schematic top view of an etch stop layer in the second embodiment of the present invention.

FIG. 8 is a schematic top view of a thin film transistor provided by a second embodiment of the present invention, and FIG. 9 is a schematic top view of an etch stop layer in the second embodiment of the present invention. As shown in FIG. 8 and FIG. 9, the structural difference between the thin film transistor in this embodiment and the thin film transistor in the first embodiment lies in that: a third via hole 12 and a fourth via hole 13 of the thin film transistor in this embodiment are rectangle.

In practical application, due to the deviation of the manufacturing process of a factory, the offset between layers is ±1.5 µm in the process of manufacturing the TFT, specifically, according to the common process capability of the existing factory, it is supposed that after the third via hole 12 for connecting the source electrode 1 with the active layer 4 and the fourth via hole 13 for connecting the drain electrode 2 with the active layer 4 are formed, the length of shorter sides of the third via hole 12 and the fourth via hole 13 is 4 µm, and the length of longer sides is 7 µm. The distance between the third via hole 12 and the fourth via hole 13 is 8 µm. The source electrode 1 covers the third via hole 12, one side of the source electrode 1 exceeds one shorter side of the third via hole 12 for 2 µm, the drain electrode 2 covers the fourth via hole 13, and one side of the drain electrode 2 exceeds one shorter side of the fourth via hole 13 for 2 µm. The sum of lengths of three sides (the dotted part in FIG. 8) of the third via hole 12 covered by the source electrode 1 is 3.5 µm+3.5 µm+4 µm=1 µm, and the sum of lengths of three sides (the dotted part) of the fourth via hole 13 covered by the drain electrode 2 is 3.5 µm+3.5 µm+4 µm=11 µm. The gate electrode 3 is overlapped with half of the third via hole 12 along the long side direction and half of the fourth via hole 13 along the long side direction respectively and is overlapped with a portion between the third via hole 12 and the fourth via hole 13, namely the width of the gate electrode 3 is 3.5 µm+8 µm+3.5 µm=15 µm.

In this case, the channel length of the TFT, namely the distance between the third via hole 12 and the fourth via hole 13, is 8 µm, and the effective width of the channel is 4 µm likewise.

The length of the opposite parts of the source electrode 1 and the gate electrode 3 is the width of the source electrode 1: W1=8 µm, and the width of the opposite parts of the source electrode 1 and the gate electrode 3 is: the sum of the side length of half of the longer side of the third via hole 12 covered by the gate electrode 3 and the length of one side of the source electrode 1 exceeding one side of the third via hole 12, namely D1=3.5 µm+2 µm=5.5 µm, so the area of the opposite parts of the source electrode 1 and the gate electrode 3 is S3=D1×W1=5.5 µm×8 µm=44 $\mu m^2$. Similarly, the area of the opposite parts of the drain electrode 2 and the gate electrode 3 is also 44 $\mu m^2$.

Figure 10:
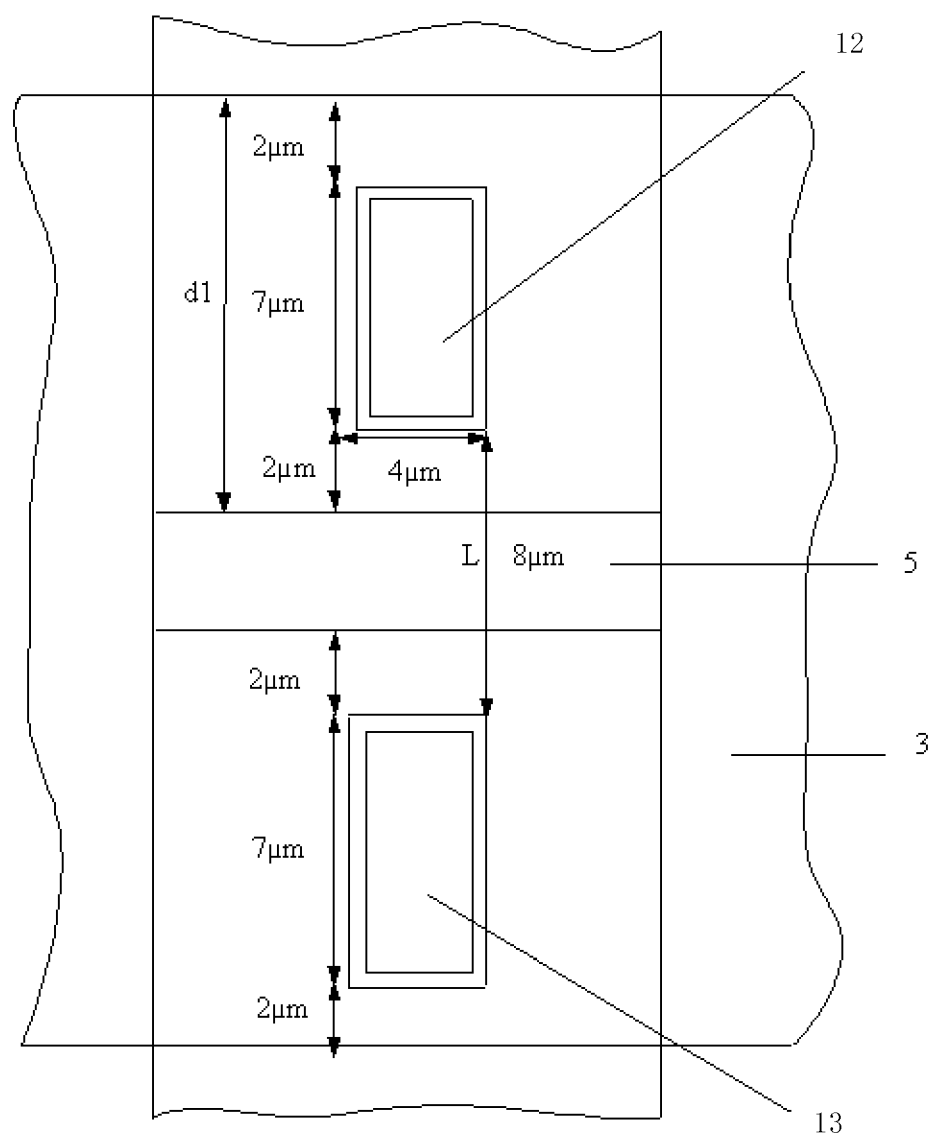
FIG. 10 is a schematic top view of an etch stop layer in the thin film transistor of the prior art.

FIG. 10 is a schematic top view of the etch stop layer in the thin film transistor of the prior art. As shown in FIG. 10, in the existing thin film transistor, the gate electrode 3 is completely overlapped with the third via hole 12 and the fourth via hole 13, then the channel length of the TFT, namely the distance between the third via hole 12 and the fourth via hole 13, is 8 µm; and the effective width of the channel is 4 µm likewise. The length of the opposite parts of the source electrode 1 and the gate electrode 3 is the width of the source electrode 1: W1=8 µm; and the width of the opposite parts of the source electrode 1 and the gate electrode 3 is: the sum of the longer side length of the third via hole 12 covered by the gate electrode 3, the length of one side of the gate electrode 3 exceeding one shorter side of the third via hole 12, and the length of one side of the source electrode 1 exceeding another shorter side of the third via hole 12, namely d1=7 µm+2 µm+2 µm=11 µm, and the area of the opposite parts of the source electrode 1 and the gate electrode 3 is S4=d1×W1=11 µm×8 µm=88 $\mu m^2$. Similarly, the area of the opposite parts of the drain electrode 2 and the gate electrode 3 is also 88 $\mu m^2$.

As can be seen from above, by comparing the two designs, the channel widths are set as 4 µm likewise, and the channel lengths are set as 8 µm likewise. However, in the reference direction perpendicular to the TFT substrate, the area of the source electrode facing the gate electrode and the area of the drain electrode facing the gate electrode in the TFT of this embodiment are respectively reduced by 44 $\mu m^2$ with respect to those in the TFT of the prior art.

In practical application, the parasitic capacitance between the source and gate electrodes of the TFT is mainly determined by the area of the source electrode facing the gate electrode, the parasitic capacitance between the drain and gate electrodes is mainly determined by the area of the drain electrode facing the gate electrode, and it could be observed according to the calculation result that, under the condition of TFT channel widths being equal and TFT occupied areas being approximately equal, the area of the source electrode facing the gate electrode and the area of the drain electrode facing the gate electrode in the TFT of this embodiment are greatly reduced. The aperture ratio is relevant to the TFT occupied area, namely the larger the TFT occupied area is, the lower the aperture ratio of pixels is, whereas the smaller the TFT occupied area is, the higher the aperture ratio of pixels is. It could be observed from the above calculation result that S3 is 44 $\mu m^2$ and S4 is 88 $\mu m^2$ that, this embodiment effectively reduces the parasitic capacitances between the source and gate electrodes and between the source and drain electrodes and achieves the purposes of reducing fluctuation of a pixel voltage and improving the display effect without affecting the aperture ratio of pixels.

It should be understood that, the above specific example is merely an example of an extreme case when the size of the formed via holes approaches the limit capability of the exposure machine. In practice, when the size of the via holes to be formed is relatively large, the practical shape of the via holes is a rectangle with rounded corners, then if the width of the channel needs to be kept unchanged, the gate electrode is not required to be overlapped with half of each via hole, and only the part of the gate electrode overlapped with each via hole needs to cover the rounded corner parts on one side, namely the gate electrode may be respectively overlapped with at least the two rounded corner parts at one side of the first via hole and at one side of the second via hole.

Compared with the thin film transistor in the prior art, the thin film transistor provided by this embodiment has the advantages that the parasitic capacitances between the source and gate electrodes and between the drain and gate electrodes are reduced and the purposes of reducing fluctuation of a pixel voltage and improving the display effect may be achieved under the condition of identical TFT channel length and channel width by reducing the areas of the opposite parts between the gate electrode and the source electrode and between the gate electrode and the drain electrode.

A third embodiment of the present invention provides an array substrate, the array substrate adopts the thin film transistor in the first embodiment or the second embodiment, and the specific implementation of the third embodiment may refer to the first embodiment or the second embodiment, and is no longer specifically described herein.

The array substrate provided by this embodiment comprises the thin film transistor of the above embodiment. The parasitic capacitances between the source and gate electrodes and between the drain and gate electrodes are reduced and the purposes of reducing fluctuation of a pixel voltage and improving the display effect may be achieved by reducing the areas of the opposite parts between the gate electrode and the source electrode and between the gate electrode and the drain electrode in the thin film transistor.

A fourth embodiment of the present invention provides a display device, the display device comprises the above array substrate, and the display device may be any product or component with a display function such as a liquid crystal panel, electronic paper, an OLED panel, a mobile phone, a tablet PC, a television, a display, a notebook computer, a digital photo frame, a navigator or the like.

The display device provided by this embodiment comprises the array substrate of the above embodiment, and the array substrate comprises the thin film transistor of the above embodiment. The parasitic capacitances between the source and gate electrodes and between the drain and gate electrodes are reduced and the purposes of reducing fluctuation of a pixel voltage and improving the display effect may be achieved by reducing the areas of the opposite parts between the gate electrode and the source electrode and between the gate electrode and the drain electrode in the thin film transistor.

Figure 11:
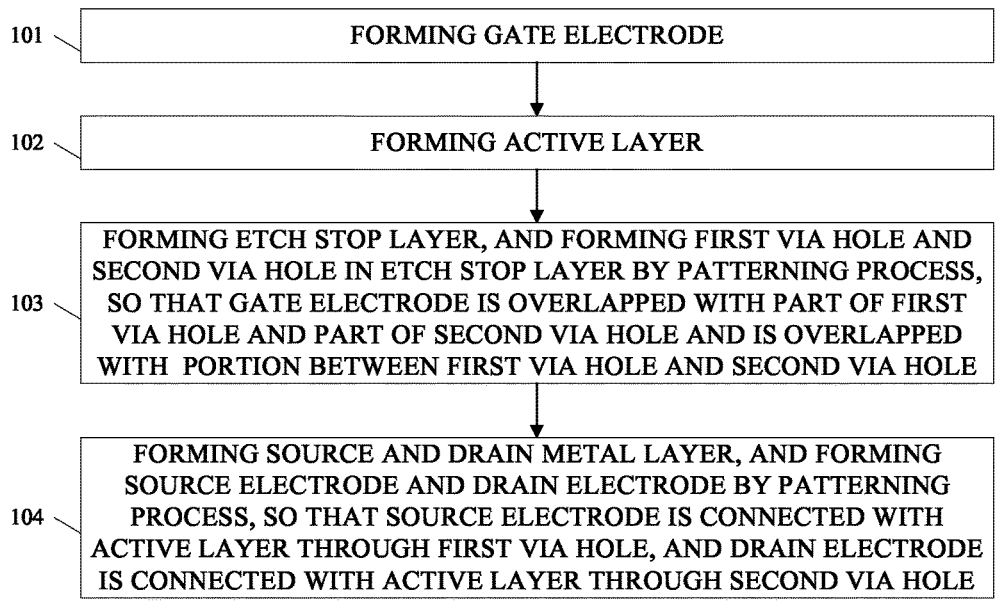
FIG. 11 is a flowchart of a manufacturing method of a thin film transistor provided by a fifth embodiment of the present invention.

FIG. 11 is a flowchart of a manufacturing method of a thin film transistor provided by a fifth embodiment of the present invention. As shown in FIG. 11, the method comprises following steps 101 to 104.

In step 101, a gate electrode is formed. The gate electrode may be formed by a patterning process, and the patterning process may at least include the processes of applying a photoresist, masking with a mask plate, exposing, developing, etching, stripping the photoresist and the like.

In step 102, an active layer is formed. The active layer in this step is not anticorrosive, and an etch stop layer needs to be provided thereon. The shape, thickness and forming method of the active layer are not limited herein.

In step 103, the etch stop layer is formed, and a first via hole and a second via hole are formed in the etch stop layer by using the patterning process, so that the gate electrode is overlapped with a part of the first via hole and a part of the second via hole and is overlapped with a portion between the first via hole and the second via hole. The etch stop layer in this step may be a silicon oxide (SiOx) film layer, a silicon nitride (SiNx) film layer or a composite layer formed by silicon oxide (SiOx) and silicon nitride (SiNx).

In step 104, a source and drain metal layer is formed, and a source electrode and a drain electrode are formed by using the patterning process, the source electrode is connected with the active layer through the first via hole, and the drain electrode is connected with the active layer through the second via hole.

It should be noted that, in practical application, the step of forming the gate electrode may vary according to whether a bottom-gate type thin film transistor or a top-gate type thin film transistor is manufactured, e.g. when the bottom-gate type thin film transistor is manufactured, the gate electrode is provided below an active layer pattern, and the source electrode and the drain electrode may be manufactured after the gate electrode is manufactured; and when the top-gate type thin film transistor is manufactured, the gate electrode is positioned above the active layer pattern, and the gate electrode may be manufactured after the source electrode and the drain electrode are manufactured According to the manufacturing method of the thin film transistor provided by this embodiment, the via holes for connecting the source electrode with the active layer and connecting the drain electrode with the active layer and the gate electrode are optimized, so that on the premise that the manufacturing flow is substantially unchanged, the parasitic capacitances between the source and gate electrodes and between the drain and gate electrodes in the manufactured TFT are reduced, and the purposes of reducing fluctuation of a pixel voltage and improving the display effect are achieved.

It could be understood that, the above embodiments are merely exemplary embodiments adopted for describing the principle of the present invention, rather than limiting the present invention. Various variations and modifications may be made for those of ordinary skill in the art without departing from the spirit and essence of the present invention, and these variations and modifications fall within the protection scope of the present invention.

The invention claimed is:

1. A thin film transistor, comprising a gate electrode, an active layer, an etch stop layer, a source electrode and a drain electrode, wherein the etch stop layer is provided between the active layer and the source and drain electrodes, a first via hole and a second via hole are formed in the etch stop layer, the source electrode is connected with the active layer through the first via hole, the drain electrode is connected with the active layer through the second via hole, wherein the gate electrode is overlapped with a part of the first via hole and a part of the second via hole respectively and is overlapped with a portion of the etch stop layer that is between the first via hole and the second via hole, wherein the gate electrode is overlapped with half of the first via hole and half of the second via hole in a plan view, respectively, wherein the etch stop layer has a same width as the source electrode and the drain electrode in an extending direction of the gate electrode in the plan view;

wherein a length of the source electrode exceeding the first via hole in a direction close to the drain electrode is the same as a length of the gate electrode covering the first via hole in a width direction of the gate electrode, and a length of the drain electrode exceeding the second via hole in a direction close to the source electrode is the same as a length of the gate electrode covering the second via hole in a width direction of the gate electrode.

2. The thin film transistor of claim 1, wherein the first via hole and the second via hole are of rectangles with rounded corners; a projection of one side of the gate electrode overlapped with the first via hole on a plane of the first via hole is respectively intersected with two opposite straight sides of the first via hole; and a projection of another side of the gate electrode overlapped with the second via hole on a plane of the second via hole is respectively intersected with two opposite straight sides of the second via hole.

3. The thin film transistor of claim 2, wherein the gate electrode is overlapped with at least two rounded corner parts at one side of the first via hole and at least two rounded corner parts at one side of the second via hole, respectively.

4. The thin film transistor of claim 1, wherein shapes of the first via hole and the second via hole are identical to each other.

5. The thin film transistor of claim 1, wherein areas of the first via hole and the second via hole in a plan view are equal to each other.

6. The thin film transistor of claim 1, wherein the active layer is an indium gallium zinc oxide film layer.

7. The thin film transistor of claim 1, wherein the etch stop layer is a silicon oxide film layer, a silicon nitride film layer or a composite layer formed by silicon oxide and silicon nitride.

8. The thin film transistor of claim 1, wherein the gate electrode, a gate insulating layer, the active layer, the etch stop layer, the source electrode and the drain electrode are sequentially provided from a substrate side for providing the thin film transistor.

9. The thin film transistor of claim 1, wherein the active layer, the etch stop layer, the source electrode and the drain electrode, a gate insulating layer and the gate electrode are sequentially provided from a substrate side for providing the thin film transistor.

10. A display device, comprising an array substrate, the array substrate comprising a thin film transistor, wherein
the thin film transistor comprises a gate electrode, an active layer, an etch stop layer, a source electrode and a drain electrode,
the etch stop layer is provided between the active layer and the source and drain electrodes, a first via hole and a second via hole are formed in the etch stop layer, the source electrode is connected with the active layer through the first via hole, and the drain electrode is connected with the active layer through the second via hole, and
the gate electrode is overlapped with a part of the first via hole and a part of the second via hole respectively and is overlapped with a portion of the etch stop layer that is between the first via hole and the second via hole,
wherein the gate electrode is overlapped with half of the first via hole and half of the second via hole in a plan view, respectively,
wherein the etch stop layer has a same width as the source electrode and the drain electrode in an extending direction of the gate electrode in the plan view;

wherein a length of the source electrode exceeding the first via hole in a direction close to the drain electrode is the same as a length of the gate electrode covering the first via hole in a width direction of the gate electrode, and a length of the drain electrode exceeding the second via hole in a direction close to the source electrode is the same as a length of the gate electrode covering the second via hole in a width direction of the gate electrode.

11. The display device of claim 10, wherein the first via hole and the second via hole are of rectangles with rounded corners;
a projection of one side of the gate electrode overlapped with the first via hole on a plane of the first via hole is respectively intersected with two opposite straight sides of the first via hole; and
a projection of another side of the gate electrode overlapped with the second via hole on a plane of the second via hole is respectively intersected with two opposite straight sides of the second via hole.

12. The display device of claim 11, wherein the gate electrode is overlapped with at least two rounded corner parts at one side of the first via hole and at least two rounded corner parts at one side of the second via hole, respectively.

13. The display device of claim 10, wherein shapes of the first via hole and the second via hole are identical to each other, and
areas of the first via hole and the second via hole in a plan view are equal to each other.

14. The display device of claim 10, wherein the active layer is an indium gallium zinc oxide film layer.

15. The display device of claim 10, wherein the etch stop layer is a silicon oxide film layer, a silicon nitride film layer or a composite layer formed by silicon oxide and silicon nitride.

16. A manufacturing method of a thin film transistor, comprising steps of:
forming a gate electrode;
forming an active layer;
forming an etch stop layer, and forming a first via hole and a second via hole in the etch stop layer by a patterning process, so that the gate electrode is overlapped with a part of the first via hole and a part of the second via hole and is overlapped with a portion of the etch stop layer that is between the first via hole and the second via hole; and
forming a source and drain metal layer, and forming a source electrode and a drain electrode by a patterning process, so that the source electrode is connected with the active layer through the first via hole, and the drain electrode is connected with the active layer through the second via hole,
wherein the gate electrode is overlapped with half of the first via hole and half of the second via hole in a plan view, respectively,
wherein the etch stop layer has a same width as the source electrode and the drain electrode in an extending direction of the gate electrode in the plan view;
wherein a length of the source electrode exceeding the first via hole in a direction close to the drain electrode is the same as a length of the gate electrode covering the first via hole in a width direction of the gate electrode, and a length of the drain electrode exceeding the second via hole in a direction close to the source electrode is the same as a length of the gate electrode covering the second via hole in a width direction of the gate electrode.

17. The manufacturing method of claim 16, wherein the first via hole and the second via hole are of rectangles with rounded corners, and the gate electrode is overlapped with at least two rounded corner parts at one side of the first via hole and at least two rounded corner parts at one side of the second via hole, respectively.

* * * * *